(12) United States Patent
Barnes et al.

(10) Patent No.: US 6,727,436 B2
(45) Date of Patent: Apr. 27, 2004

(54) INTERCONNECT BUS CROSSOVER FOR MEMS

(75) Inventors: Stephen Matthew Barnes, Albuquerque, NM (US); Murray Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 143 days.

(21) Appl. No.: 10/098,886

(22) Filed: Mar. 15, 2002

(65) Prior Publication Data

US 2003/0173112 A1 Sep. 18, 2003

(51) Int. Cl.[7] .................................................. H05K 1/03
(52) U.S. Cl. ........................ 174/255; 174/261; 174/264; 361/775; 361/800
(58) Field of Search ................... 174/254, 255, 174/261, 264, 68.2, 268; 361/752, 800, 772–775, 816

(56) References Cited

U.S. PATENT DOCUMENTS

| | | | | |
|---|---|---|---|---|
| 3,644,661 A | * | 2/1972 | Asar et al. ................... 174/261 |
| 5,422,440 A | * | 6/1995 | Palma ..................... 174/133 B |
| 5,424,492 A | * | 6/1995 | Petty et al. .................. 174/250 |
| 5,455,393 A | * | 10/1995 | Ohshima et al. ............. 174/250 |
| 5,670,749 A | * | 9/1997 | Wieloch et al. ............. 174/260 |
| 5,777,277 A | * | 7/1998 | Inagawa ..................... 174/265 |
| 5,783,340 A | | 7/1998 | Farino et al. .................. 430/22 |
| 5,798,283 A | | 8/1998 | Montague et al. ............. 438/24 |
| 5,804,084 A | | 9/1998 | Nasby et al. ................... 216/2 |
| 5,909,012 A | * | 6/1999 | Todd et al. .................. 174/266 |
| 5,919,548 A | | 7/1999 | Barron et al. ................ 428/138 |
| 5,963,788 A | | 10/1999 | Barron et al. .................. 438/48 |
| 6,020,272 A | | 2/2000 | Fleming ...................... 438/734 |
| 6,082,208 A | | 7/2000 | Rodgers et al. ................ 74/406 |
| 6,384,346 B1 | * | 5/2002 | Chang et al. ................ 174/261 |
| 6,392,164 B1 | * | 5/2002 | Iwaki et al. ................. 174/262 |
| 6,423,909 B1 | * | 7/2002 | Haynie et al. ............... 174/261 |

* cited by examiner

Primary Examiner—Evan Pert
Assistant Examiner—Jose H. Alcala
(74) Attorney, Agent, or Firm—Marsh Fischmann & Breyfogle LLP

(57) ABSTRACT

A shielded interconnect bus crossover useful in interconnecting MEM devices with control signal sources or the like and a method of fabricating such a shielded interconnect bus crossover are disclosed. In one embodiment, a shielded interconnect bus crossover (10) includes a plurality of base pads (44A–C) and a plurality of support columns (74) extending upward from the base pads (44A–C) through holes formed in an interconnect bus shield (78) overlying a plurality of interconnect bus lines (42). The support columns (74) support a two layer elevated crossing line (92/112) in a spaced relation above the interconnect bus shield (78). The two layer elevated crossing line (92/112) is oriented transverse to the direction of the interconnect bus lines (42) and is located within the perimeter of a two layer rectangular crossing line shield wall (96/116).

25 Claims, 11 Drawing Sheets

INTERCONNECT BUS CROSSOVER FOR MEMS

FIELD OF THE INVENTION

The present invention relates generally to microelectromechanical systems (MEMS), and more particularly to the design and fabrication of interconnect architectures for MEMS.

BACKGROUND OF THE INVENTION

MEMS can include numerous electromechanical devices fabricated on a single substrate, many of which are to be separately actuated in order to achieve a desired operation. For example, a MEMS optical switch may include numerous mirrors that are each positionable in a desired orientation for reflecting optical signals between originating and target locations upon actuation of one or more microactuators associated with each mirror. In order for each mirror to be separately positioned, separate control signals need to be supplied to the microactuators associated with each mirror. One manner of accomplishing this is to connect each microactuator to a control signal source with a separate electrical conductor (i.e., an interconnect line) fabricated on the surface of the substrate that extends between its associated microactuator and a bond pad at the periphery of the substrate where it can be easily connected to an off-chip control signal source. In this regard, the separate interconnect lines together comprise an interconnect bus and are typically arranged to run parallel with each other for substantial portions of their length.

As may be appreciated, sometimes one of the lines needs to cross the other lines in the interconnect bus in order to connect the line to its associated MEM device. For example, where mirrors are fabricated on both sides of the interconnect bus, a line on one side of the bus may need to be connected to an actuator associated with a mirror on the other side of the interconnect bus, or an interior line may need to be connected to an actuator associated with a mirror on either side of the bus. Where the lines of the interconnect bus are fabricated in the lowest level of electrically conductive material on the MEM chip, then the line must cross above the other interconnect bus.

At the scale of typical MEMS devices, there are several considerations associated with crossing one signal carrying line above the other lines of an interconnect bus. Since the crossing line is only a few microns above the other lines of the interconnect bus, the crossing line may be pulled down into undesirable contact with the other lines due to capillary forces during wet chemistry fabrication process steps or by electrostatic attractive forces during operation of the MEMS device. Also, stray particles on the surface of the MEMS chip may become wedged between the crossing line and the other interconnect bus lines below causing a short circuit. Further, undesirable cross-talk may occur between the crossing line and one or more of the other interconnect bus lines being crossed.

SUMMARY OF THE INVENTION

Accordingly, the present invention provides a shielded interconnect bus crossover for MEMS and a method for fabricating such an interconnect bus crossover having one or more electrically conductive lines that cross above one or more other electrically conductive lines of the interconnect bus. The line(s) of the shielded interconnect bus crossover is/are both physically and electrically isolated from the interconnect bus lines being crossed over by supporting the crossover line(s) with strategically located support columns and surrounding the crossover line(s) with a surrounding shield structure. The support columns prevent the crossover line(s) from being pulled down against the line(s) being crossed. The surrounding shield structure substantially reduces the possibility of cross-talk between the elevated crossing line(s) and the other interconnect bus lines and alleviates the possibility of short circuits due to particles and the like getting wedged between the crossover line(s) and the other interconnect bus lines.

According to one aspect of the present invention, a shielded interconnect bus crossover includes a substrate and first, second, and third layers of electrically conductive material overlying and supported by at least a portion of the substrate. In this regard, the first, second and third layers may, for example, be comprised of doped polysilicon. In one embodiment, the second layer is comprised of a thinner lower layer of doped polysilicon and a thicker upper layer of doped polysilicon. The substrate may, for example, be comprised of silicon. There may also be one or more intervening layers of electrically conductive material and/or dielectric layers between an upper surface of the substrate and the first electrically conductive layer. For example, in one embodiment, there is a dielectric stack comprised of a lower layer of thermal oxide and an upper layer of silicon nitride between the upper surface of the substrate and the first electrically conductive layer.

An interconnect bus is patterned from the first and second layers of electrically conductive material. The interconnect bus includes a plurality of interconnect bus lines, a plurality of interconnect bus shield walls, and an interconnect bus shield supported in a spaced relation above the interconnect bus lines by the interconnect bus shield walls. A plurality of base pads patterned from the first layer of electrically conductive material are positioned at locations within the footprint of the interconnect bus along an imaginary line extending transverse to an orientation of the interconnect bus lines. At least one of the base pads is in contact with at least one of the interconnect bus lines. A plurality of support columns patterned from the second layer of electrically conductive material overlie the base pads and extend vertically upward through holes formed in the interconnect bus shield. At least one elevated crossing line patterned from the third layer of electrically conductive material is supported in a spaced relation above the interconnect bus shield by the support columns. In one embodiment, there may also be at least one crossing line shield wall also patterned from the third layer of electrically conductive material that encircles the elevated crossing line and defines an enclosed area within which the elevated crossing line is located.

Where an additional fourth layer of electrically conductive material is available, there may be an elevated crossing line patterned from the fourth electrically conductive layer on top of the third layer elevated crossing line. In one embodiment, there may also be a crossing line shield wall patterned from the fourth layer of electrically conductive material on top of the third layer crossing line shield wall. The third and fourth layer elevated crossing lines together form a two layer elevated crossing line having enhanced rigidity as compared to a single layer elevated crossing line, which may be desirable to reduce the possibility that the elevated crossing line will be pulled down into undesirable contact with the interconnect bus shield by electrostatic or capillary attractive forces where no sacrificial material remains between the elevated crossing line and the interconnect bus shield. Where there is a lower probability that the crossing line can be pulled down against the interconnect bus shield, such as when a sacrificial material remains between the elevated crossing line and the interconnect bus shield, the interconnect bus crossover may include an electrical/particle shield patterned from the fourth electrically conductive layer that covers the enclosed area defined by the third layer crossing line shield wall. Where a fifth layer of electrically conductive material is available, the interconnect bus crossover may include an electrical/particle shield patterned from the fifth electrically conductive layer that covers the enclosed area defined by the third and fourth layer crossing line shield walls.

According to another aspect of the present invention, a method for making a shielded interconnect bus crossover that crosses at least one interconnect bus line of an interconnect bus over other interconnect lines of the interconnect bus includes the step of depositing a first layer of electrically conductive material (e.g., doped polysilicon) above at least a portion of a substrate. A plurality of base pads are formed from the first layer of electrically conductive material. In this regard, the base pads are formed at various locations within the footprint of the interconnect bus along an imaginary line extending transverse to an orientation of the interconnect bus lines with at least one of the base pads contacting at least one of the interconnect bus lines. A second layer of electrically conductive material (e.g., doped polysilicon) is deposited above the first layer of electrically conductive material. In this regard, there may be an intervening layer of sacrificial material deposited between the first and second electrically conductive layers. In one embodiment, the step of depositing a second layer of electrically conductive material comprises the steps of depositing a lower layer of doped polysilicon, depositing an intervening layer of sacrificial material, removing the intervening layer of sacrificial material, and depositing an upper layer of doped polysilicon, with the lower and upper layers together forming a single layer (i.e., the second layer) of electrically conductive material. After the second layer of electrically conductive material is deposited, a plurality of support columns are formed from the second layer of electrically conductive material. In this regard the support columns are formed to overlie the base pads and extend vertically upward therefrom through holes formed in the interconnect bus shield.

With the support columns formed in the second layer of electrically conductive material, a third layer of electrically conductive material (e.g., doped polysilicon) is deposited above the second layer of electrically conductive material. In this regard, there may be an intervening layer of sacrificial material deposited between the second and third layers of electrically conductive material. At least one elevated crossing line is formed from the third layer of electrically conductive material. In this regard, the elevated crossing line is formed to be supported in a spaced relation above the interconnect bus shield by the support columns. If desired, at least one crossing line shield wall may also be formed from the third layer of electrically conductive material. In this regard, the crossing line shield wall is formed to define an enclosed area within which the third layer elevated crossing line is located.

Where an elevated crossing line with enhanced rigidity is desired, the method of the present invention may also include the additional steps of depositing a fourth layer of electrically conductive material (e.g., doped polysilicon) above the third layer of electrically conductive material and forming at least one elevated crossing line from the fourth layer of electrically conductive material. In this regard, the elevated crossing line formed from the fourth layer of electrically conductive material is formed to overlie the elevated crossing line formed from the third layer of electrically conductive material such that the third and fourth layer elevated crossing lines together form a two layer elevated crossing line. If desired, there may also be the further step of forming at least one crossing line shield wall from the fourth layer of electrically conductive material. In this regard, the crossing line shield wall formed from the fourth layer of electrically conductive material is formed to overlie the crossing line shield wall formed from the third layer of electrically conductive material such that the third and fourth layer crossing line shield walls together define an enclosed area within which the two layer elevated crossing line is located. The method of the present invention may also include the further steps of depositing a fifth layer of electrically conductive material (e.g., doped polysilicon) above the fourth layer of electrically conductive material, and forming an electrical/particle shield from the fifth layer of electrically conductive material. In this regard, the fifth layer electrical/particle shield is formed to overlie the enclosed area defined by the third and fourth layer crossing line shield walls and to be positioned in a spaced relation above the two layer elevated crossing line. Where a two layer elevated crossing line having enhanced rigidity is not needed, the method of the present invention may include the additional steps of depositing a fourth layer of electrically conductive material (e.g., doped polysilicon) above the third layer of electrically conductive material, and forming an electrical/particle shield from the fourth layer of electrically conductive material. In this regard, the fourth layer electrical/particle shield is formed to overlie the enclosed area defined by the third layer crossing line shield wall and to be positioned in a spaced relation above the third layer elevated crossing line.

These and other aspects and advantages of the present invention will be apparent upon review of the following Detailed Description when taken in conjunction with the accompanying figures.

DESCRIPTION OF THE DRAWINGS

For a more complete understanding of the present invention and further advantages thereof, reference is now made to the following Detailed Description, taken in conjunction with the drawings, in which.

DETAILED DESCRIPTION

Figure 1A:
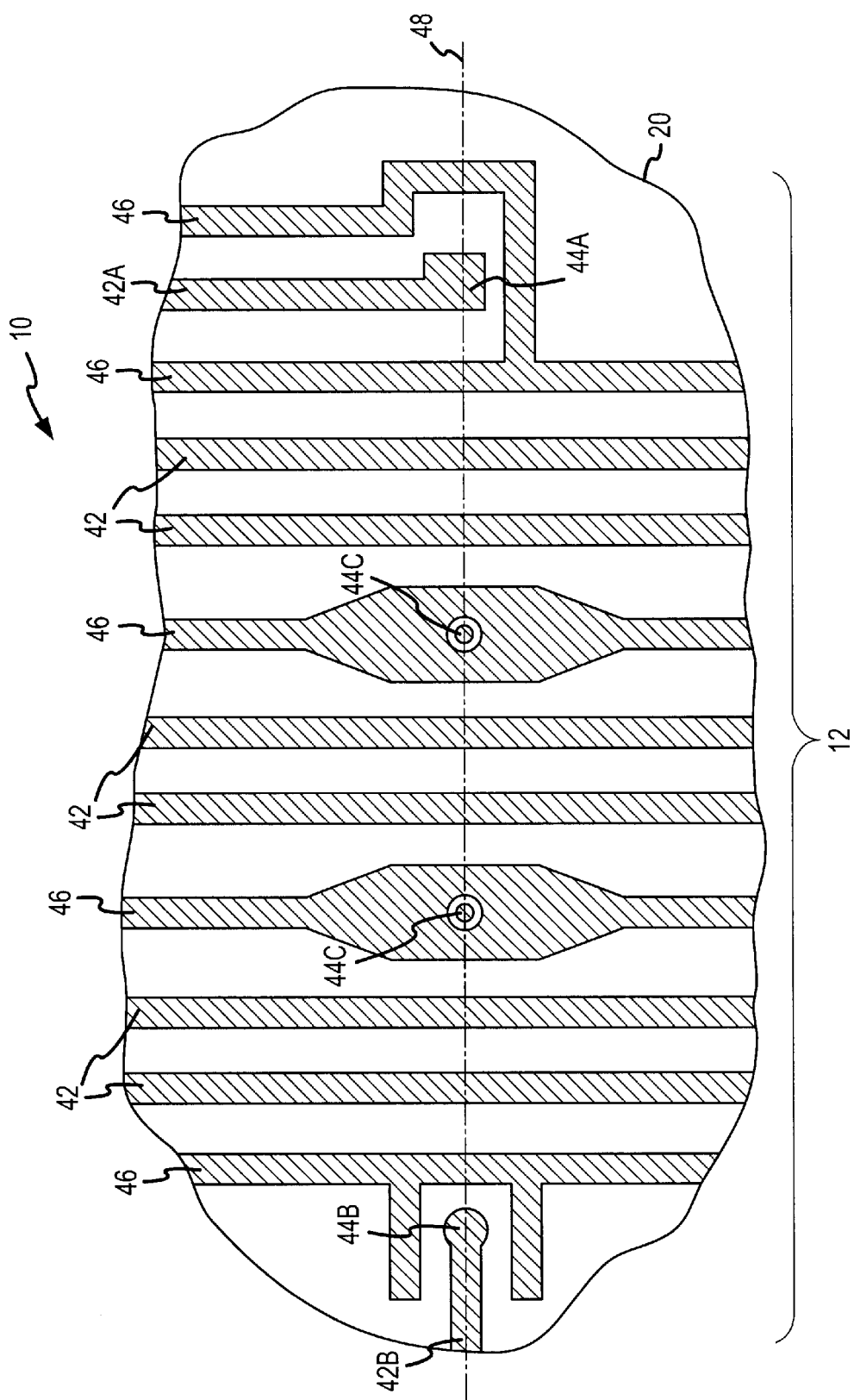
FIGS. 1A–G are top views illustrating the microfabrication process of one embodiment of a shielded interconnect bus crossover in accordance with the present invention.

In the description that follows, it should be noted that in the figures described herein, the various polysilicon and sacrificial layers and structures shown are idealized representations of the actual layers and structures that are formed in the various processing steps. In this regard, the corners of various structures may be somewhat rounded as opposed to square as is depicted, and polysilicon layers of material overlying sacrificial layers may, for example, have depressions coinciding with the locations of cuts or holes made in the sacrificial layers instead of being perfectly level across the cuts or holes. The size of the depressions and other defects, if any, may be reduced through the use of intermediate chemical mechanical polishing steps to planarize the various layers of polysilicon and sacrificial material after they are deposited.

Referring to FIGS. 1A–G and FIG. 2, there are shown top and cross-sectional views, respectively, illustrating the microfabrication process of a portion of one embodiment of a shielded interconnect bus crossover 10. The microfabrication process begins with a substrate 20 having a first dielectric layer 30 formed thereon. In this regard, the substrate 20 may be comprised of silicon, and the first dielectric layer 30 may be comprised of a lower layer 30A of thermal oxide (e.g., typically about 630 nanometers thick) formed by a wet oxidation process at an elevated temperature (e.g., 1050° C. for about 1.5 hours) and an upper layer 30B of silicon nitride (e.g., typically about 800 nanometers thick) deposited over the thermal oxide layer using a low-pressure chemical vapor deposition (LPCVD) process at a temperature of about 850° C.

A first layer of an electrically conductive material (the first electrically conductive layer 40) is deposited over the first dielectric layer 30. The first electrically conductive layer 40 is comprised of an electrically conductive material such as, for example, polycrystalline silicon (also termed polysilicon). In this regard, the first electrically conductive layer 40 is also referred to herein as the Poly0 layer 40. The Poly0 layer is typically about 300 nanometers thick with subsequent polysilicon layers being thicker (e.g., typically between about 1.0 and 2.5 microns thick). The Poly0 layer 40 (and other polysilicon layers described hereafter) may be deposited using a LPCVD process at a temperature of about 580° C. In depositing the Poly0 layer (and other polysilicon layers described hereafter), various dopant materials (e.g., phosphorous) can be employed to make the polysilicon electrically conductive.

After the Poly0 layer 40 is deposited, a plurality of parallel Poly0 interconnect lines 42 and Poly0 shield walls 46 are patterned from the Poly0 layer 40. The Poly0 interconnect lines 42 are electrically isolated from the substrate 20 along their entire length by the first dielectric layer 30 underneath the Poly0 conductive lines 42. Poly0 shield walls 46 may extend down through channels (not shown) cut in the first dielectric layer 30 to contact the upper surface of the substrate 20. The Poly0 interconnect lines and shield walls 42, 46, as with other features of the shielded interconnect bus crossover 10 wherein material is removed from one or more layers of material, may be formed, for example, by a mask and etch removal process employing appropriate masking agents and etchants depending upon the material that is to be removed.

A plurality of Poly0 base pads 44A–C are also patterned from the Poly0 layer 40. One of the Poly0 base pads 44A is located at the end of the Poly0 interconnect line 42 (the incoming line 42A) coming from a bond pad or the like at the edge of the die that is to be crossed over the interconnect bus 12. Another one of the Poly0 base pads 44B is located at the end of an interconnect line 42 (the outgoing line 42B) exiting the interconnect bus 12 on the opposite side of the interconnect bus 12 to go to a MEM device (e.g., an actuator associated with a moveable mirror). The remaining Poly0 base pads 44C are distributed within the interior of the interconnect bus 12 along an imaginary line 48 extending between pads 44A and 44B. The imaginary line 48 between pads 44A and 44B may be substantially perpendicular to the direction of the interconnect lines 42 as is illustrated, or the imaginary line 48 may be at an appropriate non-orthogonal angle to the direction of the interconnect lines 42, depending upon where the incoming interconnect line 42A terminates and the outgoing interconnect line 42B begins. The interior base pads 44C are isolated from both the Poly0 interconnect lines 42 and the Poly0 shield walls 46. In this regard, in order to accommodate the interior base pads 44C, the Poly0 adjacent interconnect lines 42 may need to be split wider apart from each other where the base pads 44C are located. FIG. 1A shows the shielded interconnect bus crossover 10 after the Poly0 interconnect lines, base pads, and shield walls 42, 44A–C, 46 have been patterned from the Poly0 layer 40.

Figure 1B:
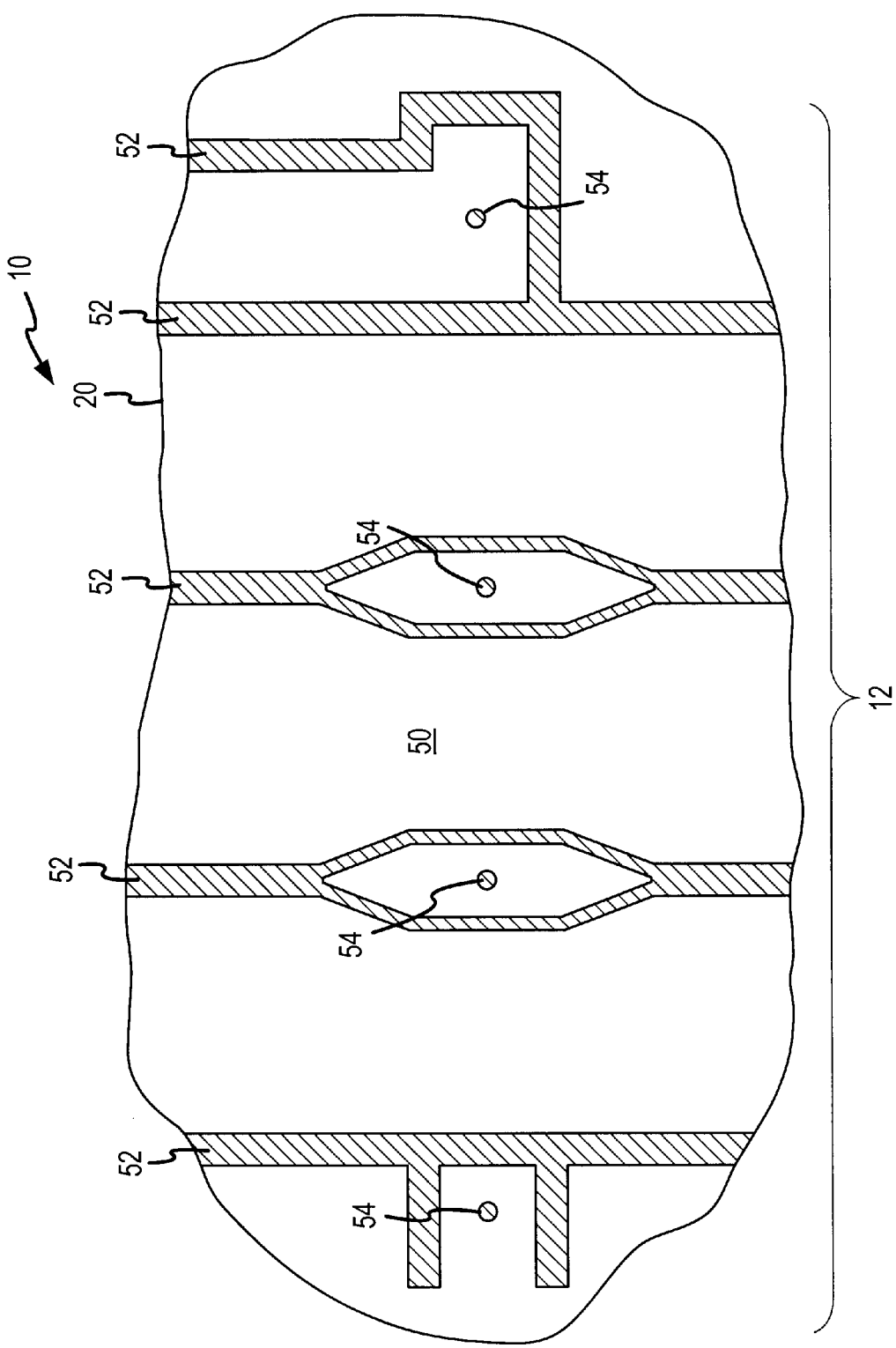

After the Poly0 interconnect lines, base pads, and shield walls 42, 44A–C, 46 are formed in the Poly0 layer 40, a second dielectric layer 50 is deposited over the Poly0 layer 40. The second dielectric layer 50 is comprised of an electrically insulating material such as, for example, a sacrificial material (e.g., silicon dioxide or silicate glass). In this regard, the second dielectric layer 50 is also referred to herein as the Sacox1 layer 50. The Sacox1 layer 50 (and other sacrificial layers described herein) may be deposited using a LPCVD process at a temperature of about 580° C. The Sacox1 layer 50 (and subsequent sacrificial layers) is typically about 2.0 microns thick. Channels 52 are made in the Sacox1 layer 50 over the Poly0 shield walls 46. Holes 54 are also made in the Sacox1 layer over the Poly0 base pads 44A–C. FIG. 1B shows the shielded interconnect bus crossover 10 after the channels 52 and holes 54 are made in the Sacox1 layer 50.

After the channels 52 and holes 54 are formed in the Sacox1 layer 50, a second layer of electrically conductive material (the second electrically conductive layer 60) is deposited. The second electrically conductive layer 60 is comprised of an electrically conductive material such as, for example, doped polysilicon. In this regard, the second electrically conductive layer 60 is also referred to herein as the Poly1 layer 60. The Poly1 layer 60 fills the bottom and sidewalls of the channels 52 and holes 54 in the Sacox1 layer 50 and covers the remaining portions of the Sacox1 layer 50.

A third layer of electrically conductive material (the third electrically conductive layer 70) is then deposited over the Poly1 layer 60. The third electrically conductive layer 70 is comprised of an electrically conductive material such as, for example, doped polysilicon. In this regard, the third electrically conductive layer 70 is also referred to herein as the Poly2 layer 70. Prior to depositing the Poly2 layer 70 over the Poly1 layer 60, a third dielectric layer (not shown) of sacrificial material may have been deposited over the Poly1 layer 60 and removed from the regions of the Poly1 layer 60 of interest to the structures described herein. The third dielectric layer (the Sacox2 layer) may be utilized in maintaining desired separation between the Poly1 and Poly2 layers 60, 70 in other microelectromechanical structures, but such separation is not desired herein. In this regard, the Poly1 and Poly2 layers 60, 70 may be considered to be a single, second layer of electrically conductive material. The Poly2 layer 70 fills in the remainder of the channels 52 and holes 54 made in the Sacox1 layer 50 to form, together with the Poly1 layer 60, Poly1/Poly2 support columns 74 on top of the Poly0 base pads 44A–C, Poly1/Poly2 shield walls 76 on top of the Poly0 shield walls 46 and a horizontal Poly1/Poly2 shield 78 over the Poly0 conductive lines 42.

Figure 1C:
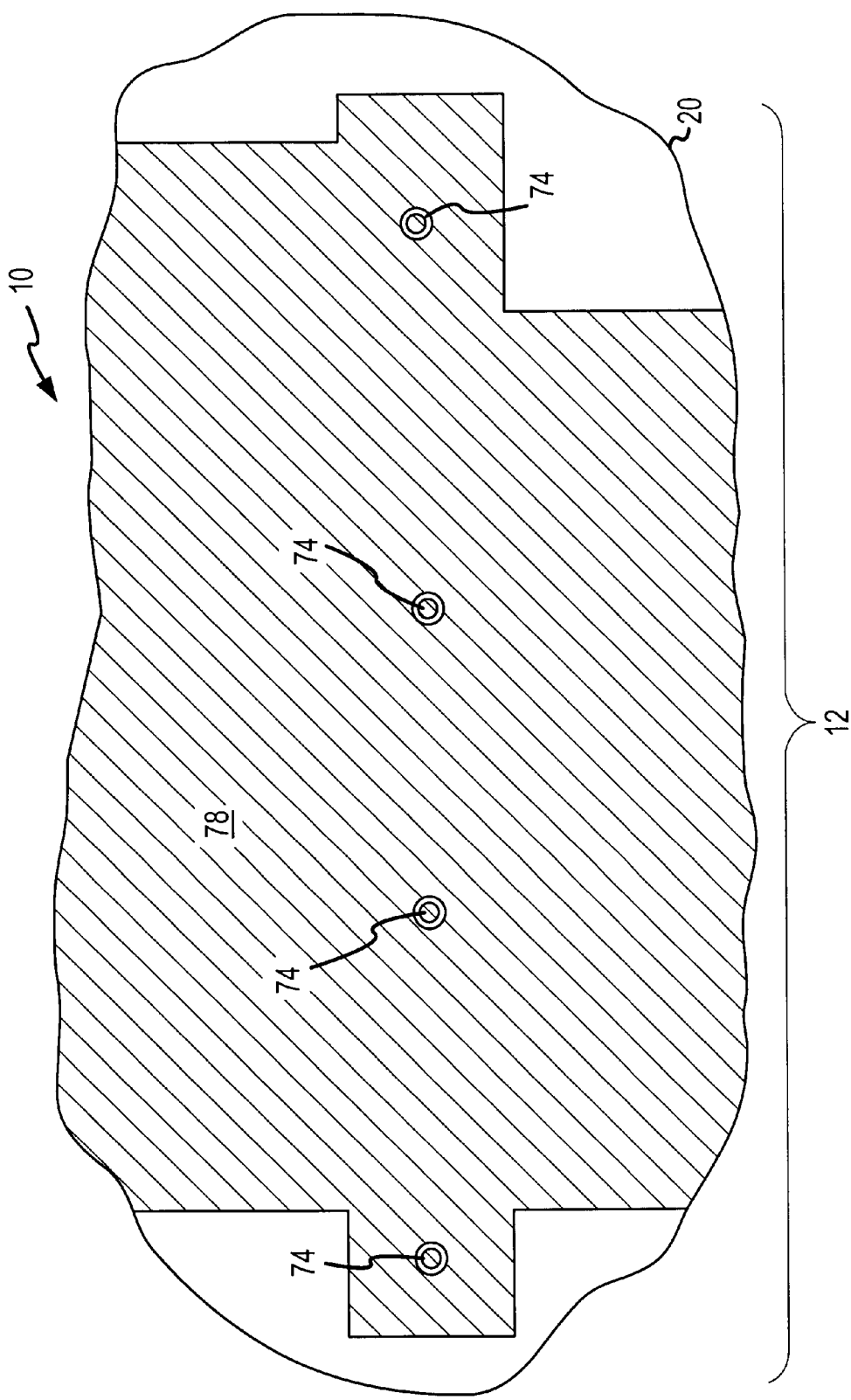

The Poly1 and Poly2 layers 60,70 are appropriately patterned in order to isolate the Poly1/Poly2 support columns 74 from the Poly1/Poly2 shield 78 and shield walls 76. FIG. 1C shows the shielded interconnect bus crossover 10 after the Poly1/Poly2 support columns 74 have been patterned from the Poly1/Poly2 layer 70.

Figure 1D:
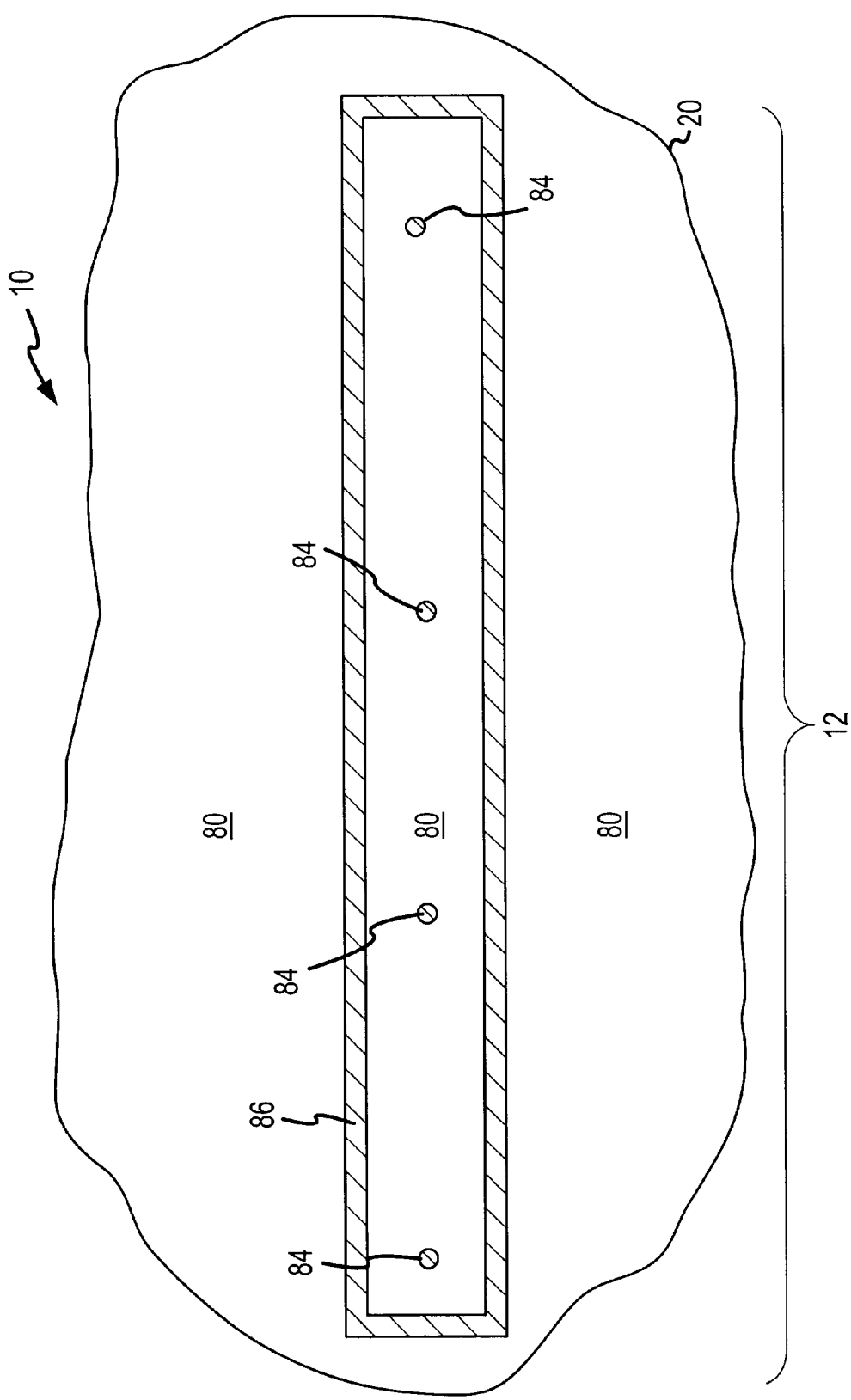

A fourth dielectric layer 80 is deposited over the Poly2 layer 70. The fourth dielectric layer 80 is comprised of an electrically insulating material such as, for example, a sacrificial material (e.g. silicon dioxide or silicate glass). In this regard, the fourth dielectric layer 80 is also referred to herein as the Sacox3 layer 80. After being deposited, holes 84 and a generally rectangular cut 86 are made in the Sacox3 layer 80. The holes 84 are aligned above the Poly1/Poly2 support columns 74 and are located within the perimeter of the rectangular cut 86. The rectangular cut 86 and holes 84, respectively, extend down through the Sacox3 layer 80 to respectively expose the upper surfaces of the Poly1/Poly2 shield 78 and Poly1/Poly2 support columns 74. The rectangular cut 86 is typically oriented to have its long dimension aligned with the imaginary line 48 between base pad 44A and based pad 44B along which interior base pads 44C are aligned. The rectangular cut 86 is sufficiently sized to permit the holes 84 to be spaced away from the inside edges of the rectangular cut 86. In this regard, each inside edge of the rectangular cut 86 is typically spaced by a minimum amount of about 2.0 microns from the edge of the nearest hole 84. FIG. 1D shows the shielded interconnect bus crossover 10 after the rectangular cut 86 and holes 84 are made in the Sacox3 layer 80.

Figure 1E:
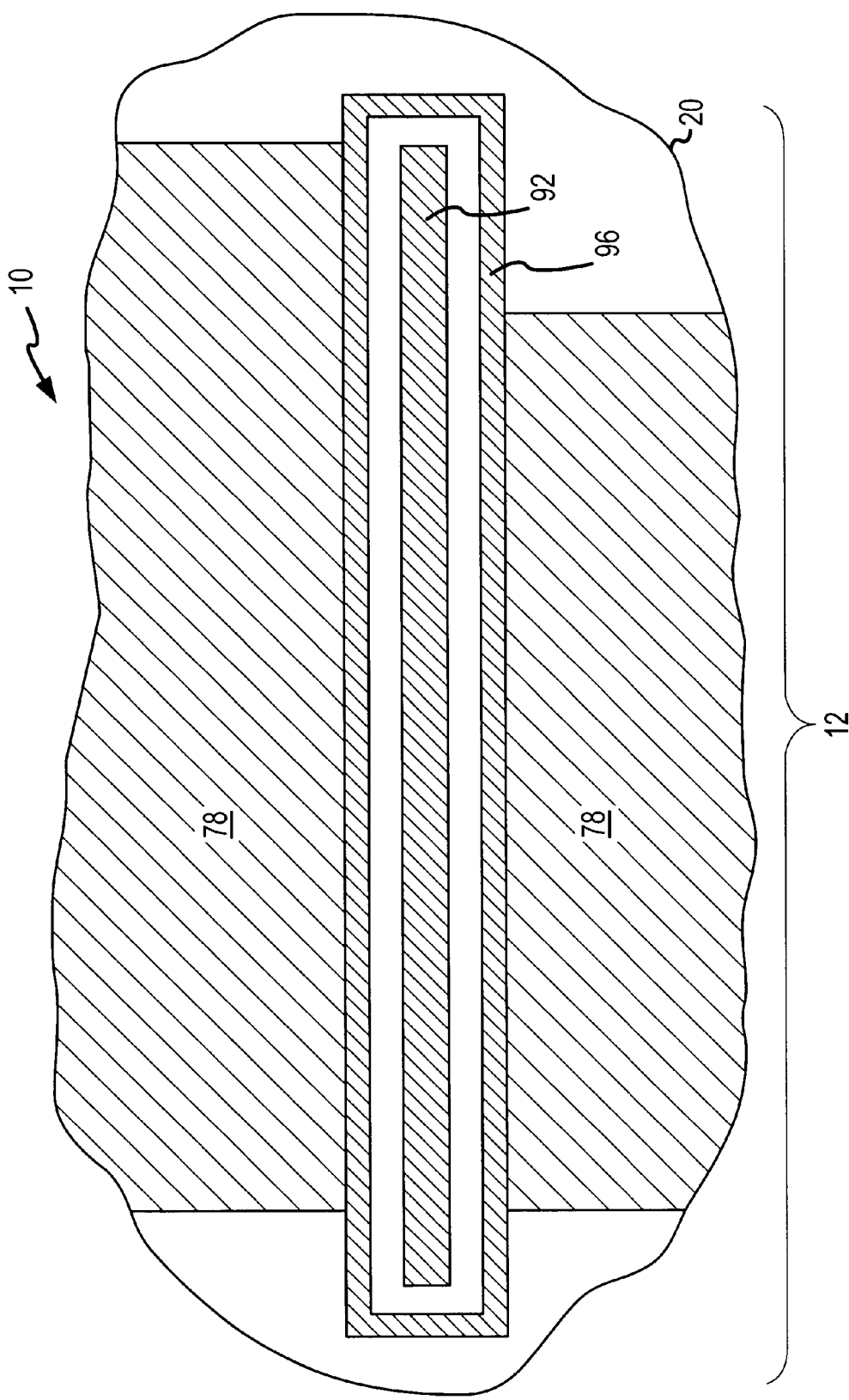

A fourth layer of an electrically conductive material (the fourth electrically conductive layer 90) is deposited over the Sacox3 layer 80. The electrically conductive material comprising the fourth electrically conductive layer 90 is, for example, doped polysilicon. In this regard, the fourth electrically conductive layer 90 is also referred to herein as the Poly3 layer 90. The Poly3 layer 90 fills in the rectangular cut 86 and holes 84 in the Sacox3 layer 80. The Poly3 layer is patterned to provide an electrically conductive Poly3 crossing line 92 within the interior of a rectangular Poly3 shield wall 96. As is shown, the upper portion of the Poly3 shield wall 96 may be wider than the rectangular cut 86 made in the Sacox3 layer 80. In this regard, the Poly3 crossing line 92 and Poly3 shield wall 96 are sized to maintain a minimum spacing (e.g., typically about 1.0 microns) between the edges of the Poly3 crossing line 92 and the inside edges of the rectangular Poly3 shield wall 96. If desired, this spacing may be increased to reduce capacitance between the Poly3 crossing line 92 and the Poly3 shield wall 96. The Poly3 crossing line 92 extends from the Poly1/Poly2 support column 74 extending upward from the Poly0 base pad 44A at the end of the incoming interconnect line 42A across the width of the interconnect bus 12 to the Poly1/Poly2 support column 74 extending upward from the Poly0 base pad 44B at the beginning of the outgoing interconnect line 42B. Along the way, the Poly3 crossing line 92 intersects the Poly1/Poly2 support columns 74 extending upward from the interior Poly0 based pads 44C. FIG. 1E shows the shielded interconnect bus crossover 10 after the Poly3 layer is patterned to provide the Poly3 crossing line 92 and Poly3 shield wall 96.

Figure 1F:
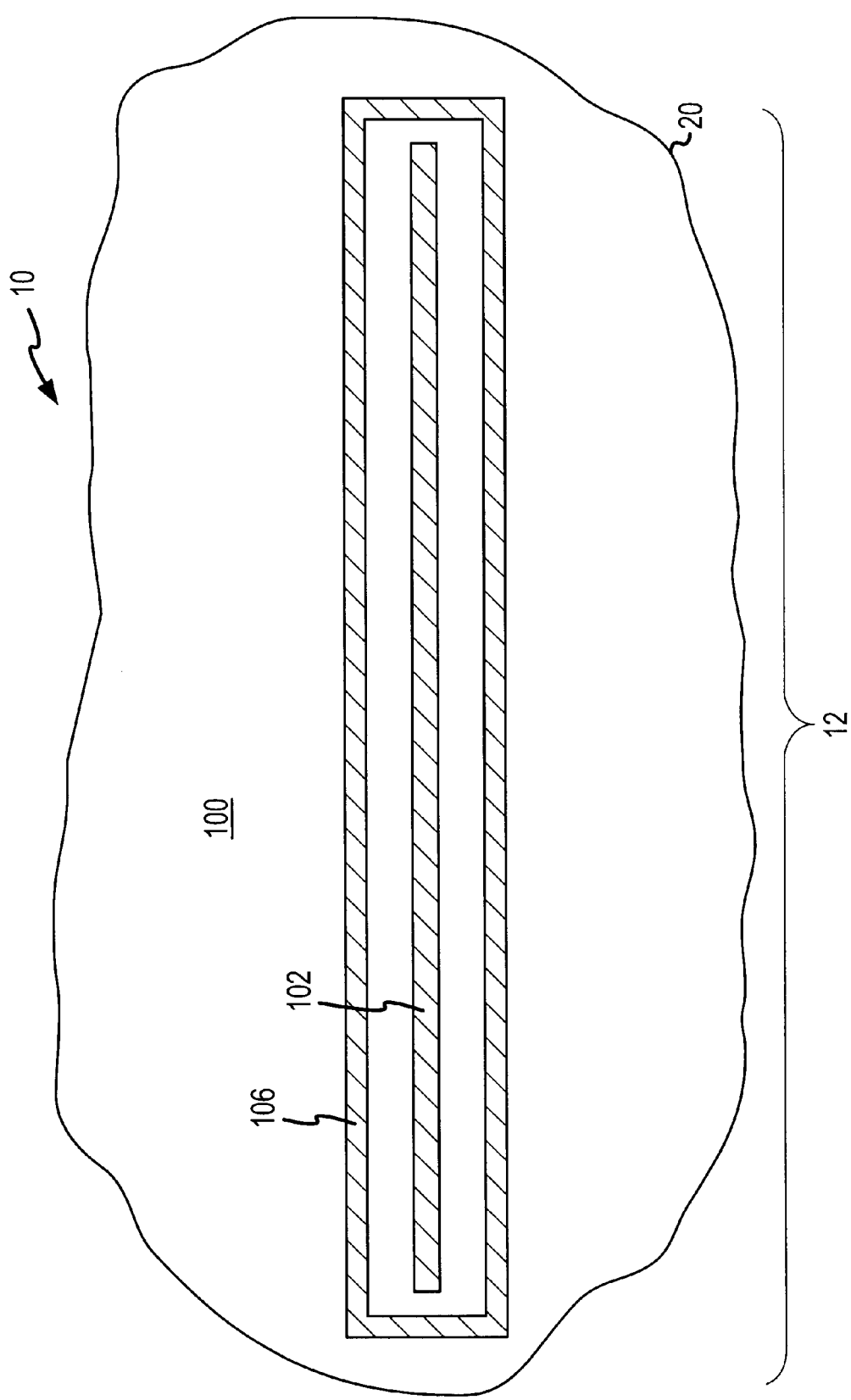

A fifth dielectric layer 100 comprised of for example, a sacrificial material (e.g. silicon dioxide or silicate glass), is formed over the Poly3 crossing line 92 and rectangular shield wall 96. The fifth dielectric layer 100 is also referred to herein as the Sacox4 layer 100. A channel 102 aligned over the Poly3 crossing line 92 and a generally rectangular cut 106 aligned over the rectangular Poly3 shield wall 96 are made in the Sacox4 layer 100. The channel 102 extends from one end of the Poly3 crossing line 92 to the other end of the Poly3 crossing line 92. FIG. 1F shows the shielded interconnect bus crossover 10 after the channel 102 and rectangular cut 106 are made in the Sacox4 layer 100.

Figure 1G:
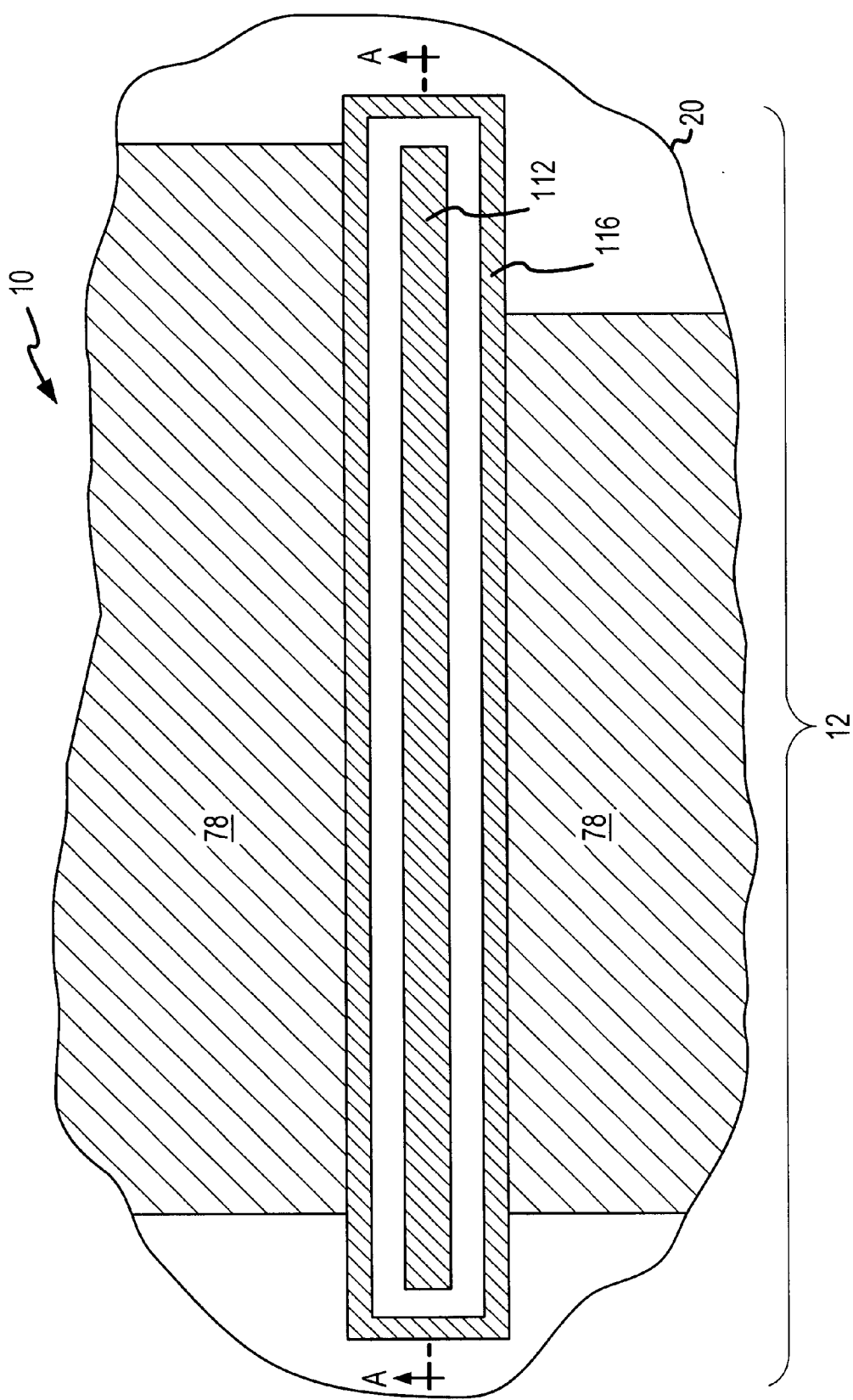
Figure 2:
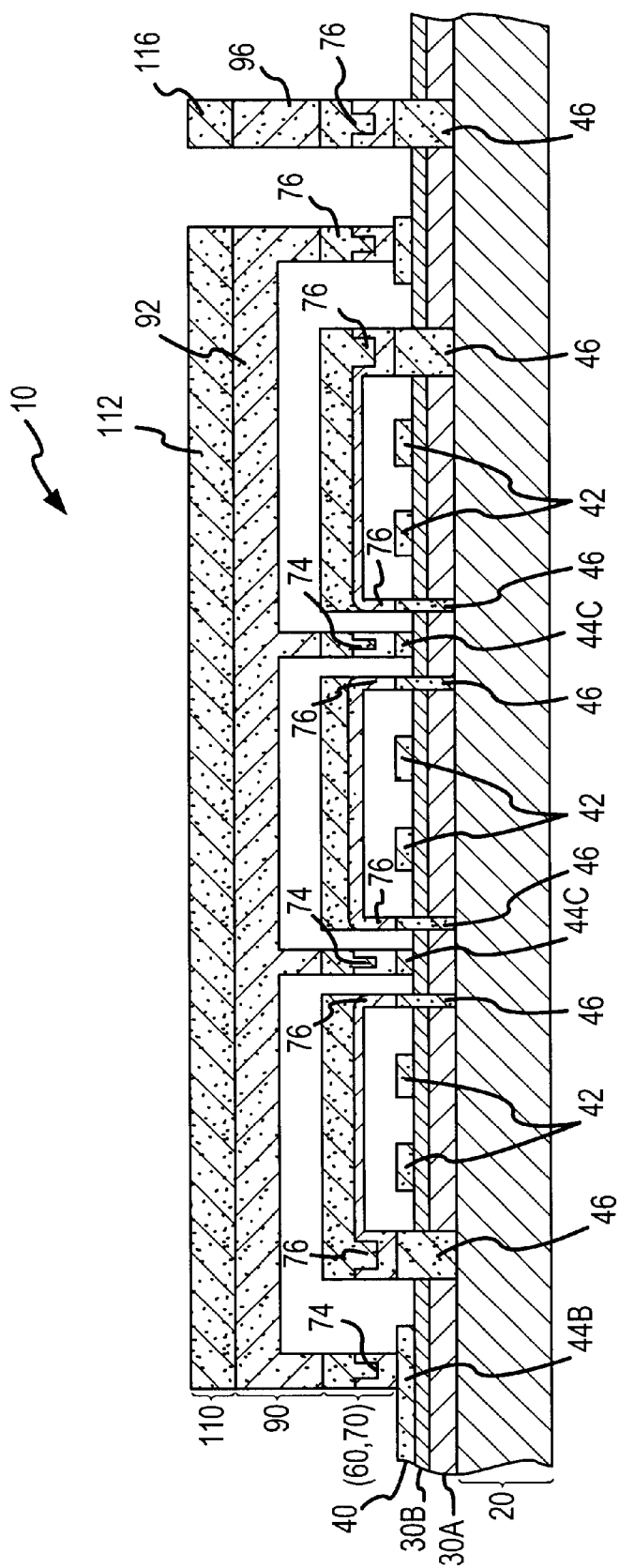
FIG. 2 is a cross-sectional view of the shielded interconnect bus crossover taken along line A—A in FIG. 1G.

A fifth electrically conductive layer 110 (also referred to herein as the Poly4 layer 110), comprised of, for example, doped polysilicon is deposited over the Sacox4 layer 100 and into the channel 102 and rectangular cut 106 in the Sacox4 layer 100. The Poly4 layer 110 is then patterned to provide a Poly4 crossing line 112 positioned over the Poly3 crossing line 92 and a rectangular Poly4 shield wall 116 positioned over the Poly3 shield wall 96. As is shown, the upper portion of the Poly4 shield wall 116 may be wider than the rectangular cut 106 made in the Sacox4 layer 100. In this regard, the Poly4 crossing line 112 and rectangular Poly4 shield wall 116 are sized in order to maintain a minimum spacing (e.g., typically about 1.0 microns) between the edges of the Poly4 crossing line 112 and the inside edges of the rectangular Poly4 shield wall 116. If desired, this spacing may be increased to reduce capacitance between the Poly4 crossing line 112 and the Poly4 shield wall 116. The Poly4 crossing line 112 extends from one end of the Poly3 crossing line 92 to the other end of the Poly3 crossing line 92. Having the Poly3 crossing line 92 paired with the Poly4 crossing line 112 provides a crossing line comprised of two polysilicon layers that is more rigid than if the crossing line were comprised of only one polysilicon layer. This is desirable where it is expected that the Sacox3 layer 80 will be removed from between the Poly1/Poly2 shield 78 covering the Poly0 interconnect lines 42 and the Poly3 crossing line 92 during an etch release step or the like, leading to the possibility that electrostatic attractive forces during operation or capillary forces during wet chemical fabrication processes will pull the single Poly3 crossing line 92 down into undesirable contact with the Poly1/Poly2 shield 78. FIG. 1G shows a top view and FIG. 2 shows a cross-sectional view of the completed shielded interconnect bus crossover.

In the previously described shielded interconnect bus crossover 10, there is only one Poly3/Poly4 crossing line 92/112 within the rectangular Poly3/Poly4 shield wall 96/116. It should be noted that in other embodiments where electrical cross-talk between adjacent Poly0 conductors 42 is not a problem, there may be multiple Poly3/Poly4 crossing lines 92/112 within the same Poly3/Poly4 shield wall 96/112 that cross multiple Poly0 conductors 42 over the interconnect bus 12. In this regard, each Poly3/Poly4 crossing line 92/112 is laterally spaced apart from each other and is supported on separate Poly1/Poly2 support columns 74 and Poly0 based pads 44 in order to keep the Poly3/Poly4 92/112 lines electrically separate. Furthermore, where multiple Poly0 interconnect lines 42 need not remain electrically separate, a single Poly3/Poly4 crossing line 92/112 may be utilized to cross multiple Poly0 interconnect lines 42 over the interconnect bus 12. It should also be noted that, where the Sacox3 layer 80 will not be removed from underneath the Poly3 crossing line 92 or where electrostatic and/or capillary attractive forces are not anticipated to be sufficient to pull the Poly3 crossing line 92 down into contact with the Poly1/Poly2 shield, it may not be necessary to form the Poly4 crossing line 112 over the Poly3 crossing line 92. In this regard, instead of making the channel 102 in the Sacox4 layer 100 over the Poly3 crossing line 92 and patterning a Poly4 crossing line 112 from the Poly4 layer 110, no channel 102 need be made in the Sacox4 layer 100 over the Poly3 crossing line 92 and the Poly4 layer 110 can be patterned to form a Poly4 electrical/particle shield that is supported in a spaced relation over a Poly3 only crossing line 92 by the Poly4 shield walls 116.

Although other microfabrication processes may be employed in fabricating a shielded interconnect bus crossover 10 as described above, the SUMMiT V™ surface micromachining process developed at Sandia National Laboratories and described, for example, in U.S. Pat. No. 6,082,208, issued Jul. 4, 2000 entitled "Method For Fabricating Five-Level Microelectromechanical Structures And Microelectromechanical Transmission Formed", incorporated by reference herein, is particularly useful for fabricating the shielded interconnect bus crossover 10. Employing the SUMMiT V™ surface micromachining process to fabricate the shielded interconnect bus crossover 10 permits easy incorporation of the shielded interconnect bus crossover 10 into MEM systems fabricated from five polysilicon levels such as some MEM mirror positioning systems useful in optical cross connects and the like.

Figure 3A:
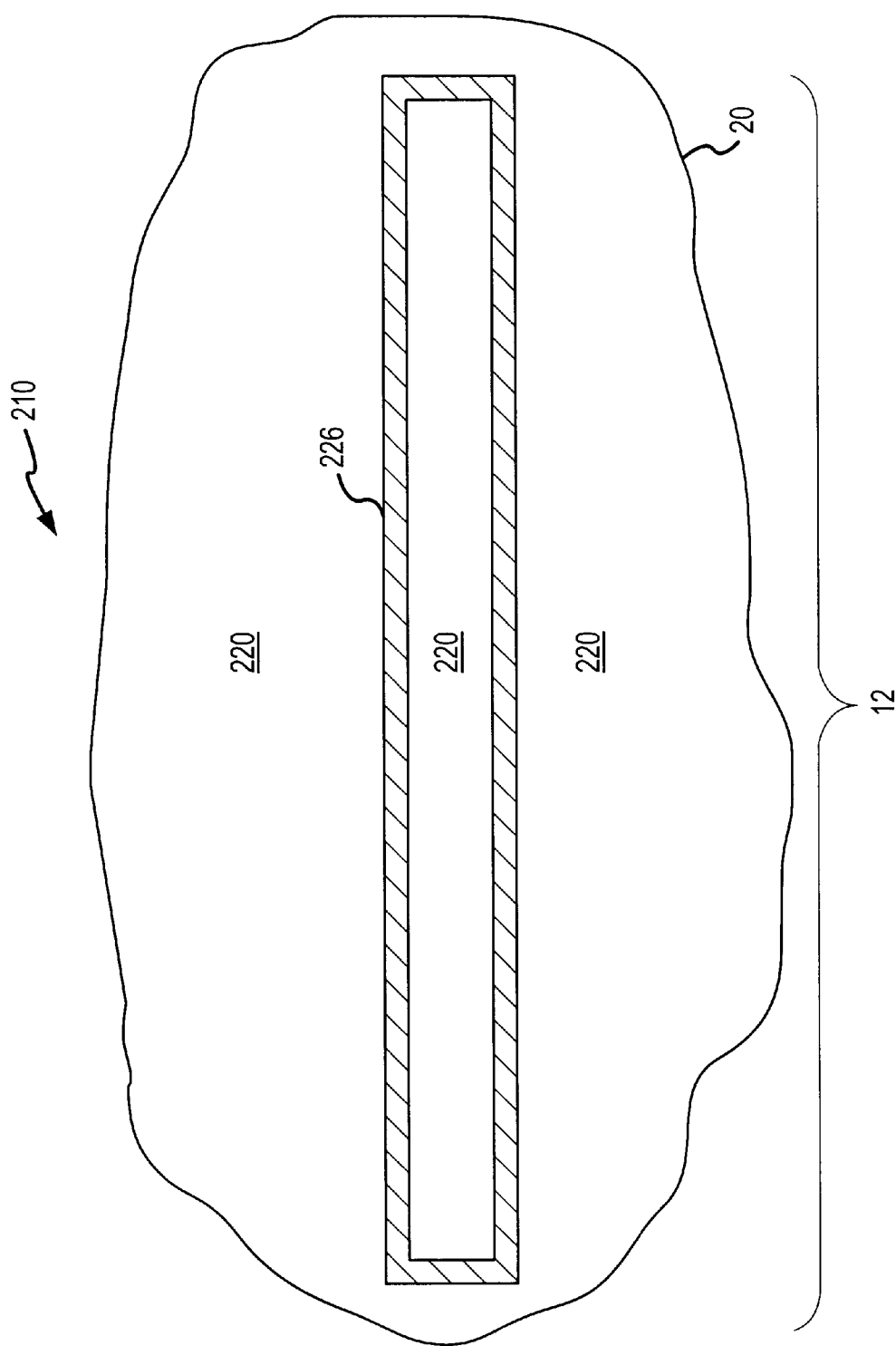
FIGS. 3A–B are top views illustrating the additional microfabrication process steps for fabricating an embodiment of a shielded interconnect bus crossover in accordance with the present invention having a fifth layer electrical/particle shield.
Figure 3B:
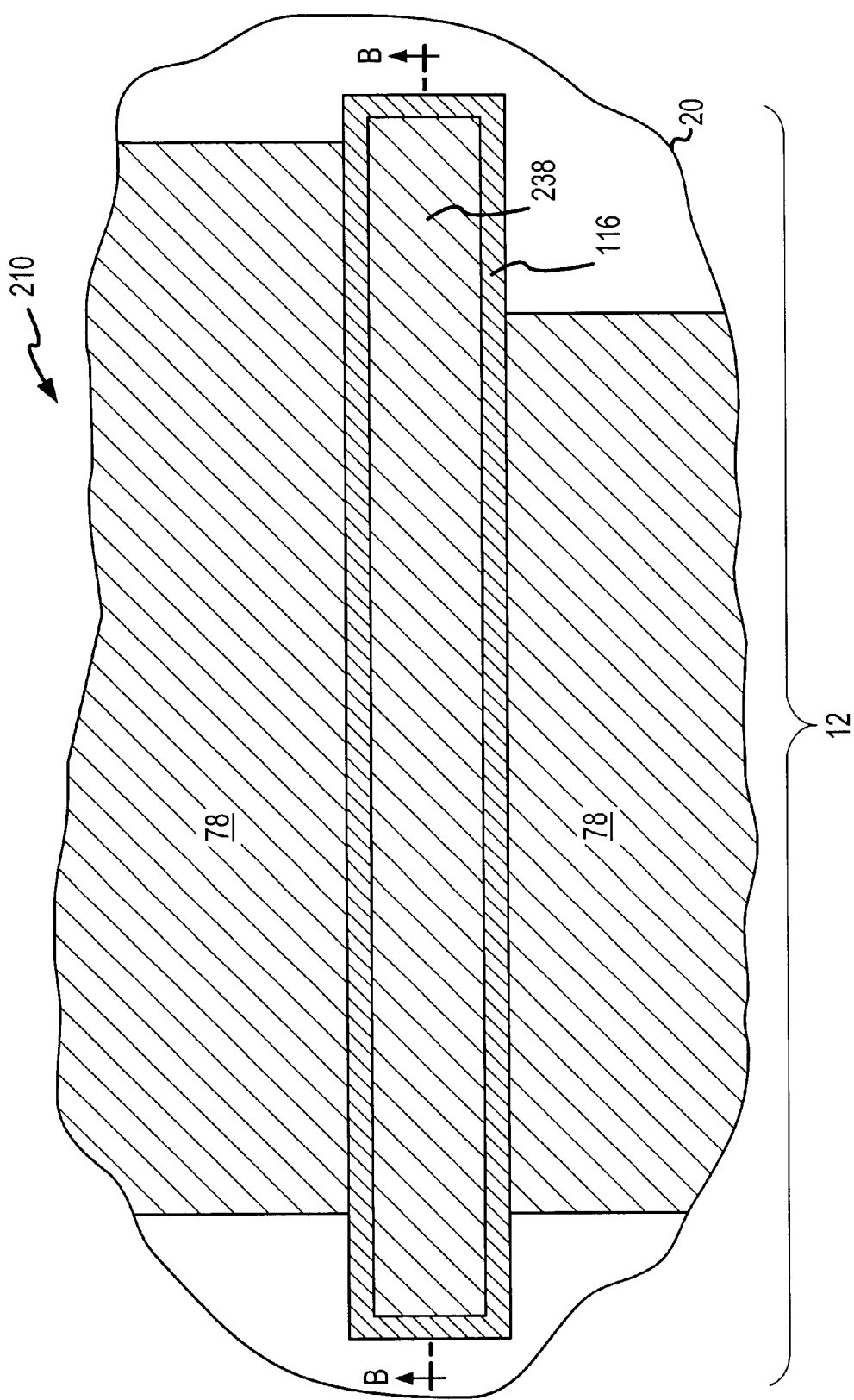
Figure 4:
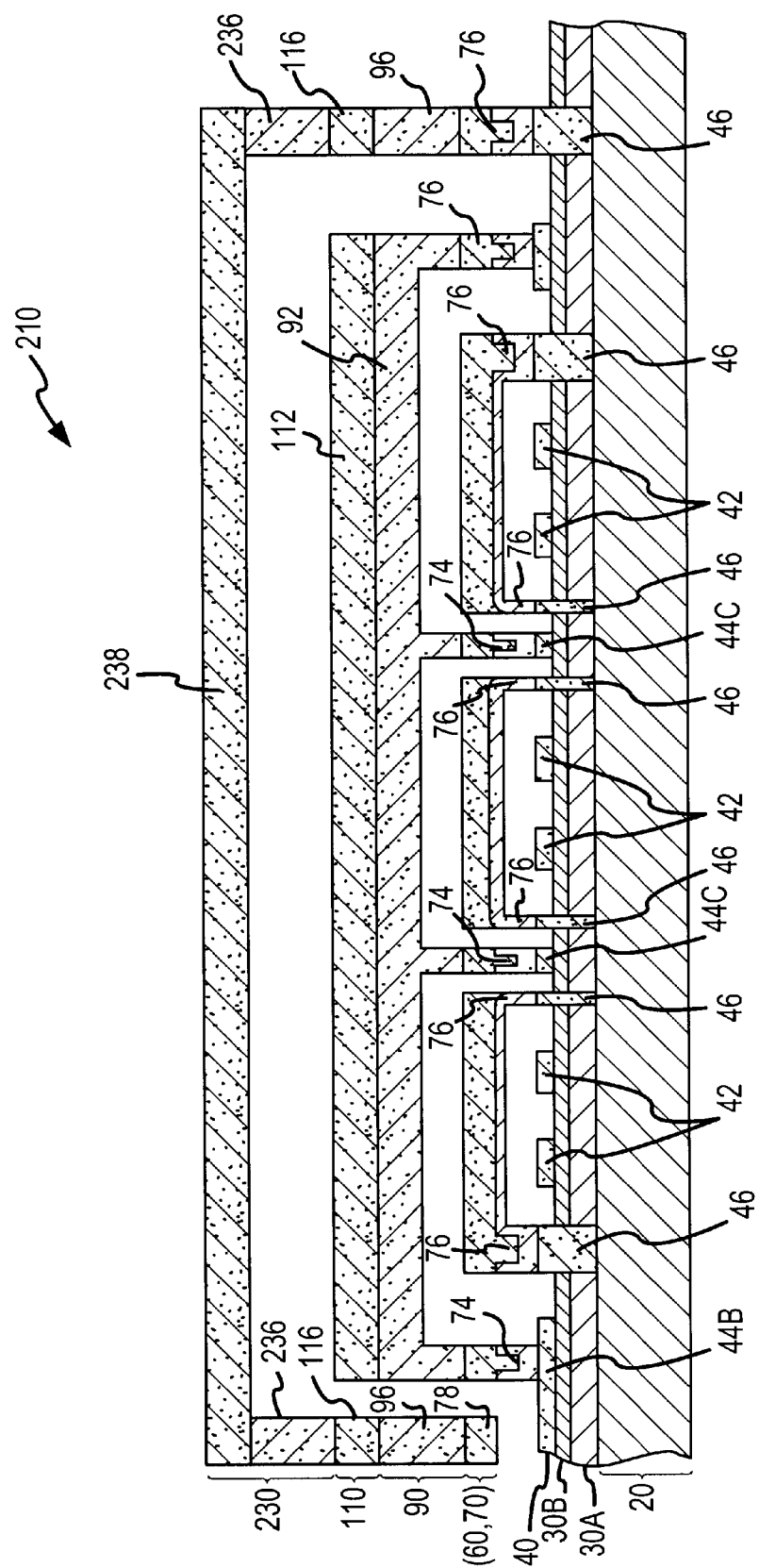
FIG. 4 is a cross-sectional view of the shielded interconnect bus crossover with a fifth layer electrical/particle shield taken along line B—B in FIG. 3B.

Referring now to FIGS. 3A–B and 4, there are shown top views and a cross-sectional view of one embodiment of a shielded interconnect bus crossover 210 that includes an electrical/particle shield 238 formed from a sixth layer of polysilicon 230. In this regard, the first five layers of the shielded interconnect bus crossover 210 are fabricated as with the previously described shielded interconnect bus crossover 10. A sixth layer of dielectric material 220 comprised of for example, a sacrificial material (e.g. silicon dioxide or silicate glass), is formed over the Poly4 crossing line 112 and rectangular shield wall 116. The sixth dielectric layer 220 is also referred to herein as the Sacox5 layer 220. A rectangular cut 226 aligned over the rectangular Poly4 shield wall 116 is made in the Sacox5 layer 220. FIG. 3A shows the shielded interconnect bus crossover 210 after the rectangular cut 226 is made in the Sacox5 layer 220.

A sixth electrically conductive layer 230 (also referred to herein as the Poly5 layer 230), comprised of, for example, doped polysilicon is deposited over the Sacox5 layer 220 and into the rectangular cut 226 in the Sacox5 layer 220. The Poly5 layer 230 is then patterned to provide a Poly5 electrical/particle shield 238 that is supported in a spaced relation above the Poly3/Poly4 crossing line 92/112 by a rectangular Poly5 shield wall 236 formed in the rectangular Sacox5 cut 226. The Poly5 electrical/particle shield 238 prevents stray particles and the like from coming into contact with the Poly3/Poly4 crossing line 92/112 and Poly1/Poly2 interconnect bus shield 78 thus preventing any particle related shorts and provides additional electrical isolation of the Poly3/Poly4 crossing line 92/112.

While various embodiments of the present invention have been described in detail, further modifications and adaptations of the present invention may occur to those skilled in the art. However, it is to be expressly understood that such modifications and adaptations are within the spirit and scope of the present invention.

What is claimed is:

1. A shielded interconnect bus crossover comprising:
   a substrate;
   first, second, and third layers of electrically conductive material overlying and supported by at least a portion of said substrate;
   an interconnect bus patterned from said first and second layers of electrically conductive material, said interconnect bus including a plurality of interconnect bus lines, a plurality of interconnect bus shield walls, and an interconnect bus shield supported in a spaced relation above said interconnect bus lines by said interconnect bus shield walls;
   a plurality of base pads patterned from said first layer of electrically conductive material, said base pads being located at locations within the footprint of said interconnect bus along an imaginary line extending transverse to an orientation of said interconnect bus lines, at least one of said base pads being in contact with at least one of said interconnect bus lines;
   a plurality of support columns patterned from said second layer of electrically conductive material, said support columns overlying said base pads and extending vertically upward through holes formed in said interconnect bus shield; and
   at least one elevated crossing line patterned from said third layer of electrically conductive material, said elevated crossing line being supported in a spaced relation above said interconnect bus shield by said support columns.

2. The shielded interconnect bus crossover of claim 1 wherein said first, second, and third layers of electrically conductive material comprise doped polysilicon.

3. The shielded interconnect bus crossover of claim 2 wherein said second layer of electrically conductive material comprises two separately deposited layers of doped polysilicon.

4. The shielded interconnect bus crossover of claim 1 further comprising:
   first, second, and third layers of dielectric material deposited over and supported by at least a portion of said substrate;
   said first layer of dielectric material being disposed between said interconnect bus lines and said substrate;
   said second layer of dielectric material being disposed between said interconnect bus shield and said interconnect bus lines; and
   said third layer of dielectric material being disposed between said elevated crossing line and said interconnect bus shield.

5. The shielded interconnect bus of claim 4 wherein said second and third layers of dielectric material comprise one of silicon dioxide and silicate glass.

6. The shielded interconnect bus of claim 4 wherein said substrate is comprised of silicon and said first dielectric layer comprises a lower layer of thermal oxide and an upper layer of silicon nitride.

7. The shielded interconnect bus crossover of claim 1 further comprising:
   a fourth layer of electrically conductive material overlying and supported by at least a portion of said substrate; and
   at least one elevated crossing line patterned from said fourth layer of electrically conductive material to overlie said elevated crossing line patterned from said third layer of electrically conductive material, said elevated crossing lines patterned from said third and fourth layers of electrically conductive material together comprising a two layer elevated crossing line.

8. The shielded interconnect bus crossover of claim 7 wherein said fourth layer of electrically conductive material comprises doped polysilicon.

9. The shielded interconnect bus crossover of claim 7 further comprising:
   at least one crossing line shield wall patterned from said third layer of electrically conductive material; and at least one crossing line shield wall patterned from said fourth layer of electrically conductive material to overlie said crossing line shield wall patterned from said third layer of electrically conductive material, said crossing line shield walls patterned from said third and fourth layers of electrically conductive material together defining an enclosed area, said two layer elevated crossing line being located within said enclosed area defined by said crossing line shield walls patterned from said third and fourth layers of electrically conductive material.

10. The shielded interconnect bus crossover of claim 9 further comprising:
a fifth layer of electrically conductive material overlying and supported by at least a portion of said substrate; and
a shield patterned from said fifth layer of electrically conductive material, said shield overlying said enclosed area defined by said crossing line shield walls patterned from said third and fourth layers of electrically conductive material and being positioned in a spaced relation above said two layer elevated crossing line.

11. The shielded interconnect bus crossover of claim 10 wherein said fifth layer of electrically conductive material comprises doped polysilicon.

12. The shielded interconnect bus crossover of claim 1 further comprising:
at least one crossing line shield wall patterned from said third layer of electrically conductive material, said crossing line shield wall defining an enclosed area, said elevated crossing line being located within said enclosed area defined by said crossing line shield wall.

13. The shielded interconnect bus crossover of claim 12 further comprising:
a fourth layer of electrically conductive material overlying and supported by at least a portion of said substrate; and
a shield patterned from said fourth layer of electrically conductive material, said shield overlying said enclosed area defined by said crossing line shield wall patterned from said third layer of electrically conductive material and being positioned in a spaced relation above said elevated crossing line patterned from said third layer of electrically conductive material.

14. The shielded interconnect bus crossover of claim 13 wherein said fourth layer of electrically conductive material comprises doped polysilicon.

15. A method for making a shielded interconnect bus crossover that crosses at least one interconnect bus line of an interconnect bus over other interconnect lines of the interconnect bus, said method comprising the steps of:
depositing a first layer of electrically conductive material above at least a portion of a substrate;
forming a plurality of base pads from the first layer of electrically conductive material, wherein the base pads are formed at various locations within the footprint of the interconnect bus along an imaginary line extending transverse to an orientation of the interconnect bus lines with at least one of the base pads contacting at least one of the interconnect bus lines;
depositing a second layer of electrically conductive material above the first layer of electrically conductive material;
forming a plurality of support columns from the second layer of electrically conductive material, wherein the support columns are formed to overlie the base pads and extend vertically upward therefrom through holes formed in the interconnect bus shield;
depositing a third layer of electrically conductive material above the second layer of electrically conductive material; and
forming at least one elevated crossing line from the third layer of electrically conductive material, wherein the elevated crossing line is formed to be supported in a spaced relation above the interconnect bus shield by the support columns.

16. The method of claim 15 wherein in said steps of depositing first, second, and third layers of electrically conductive material, the electrically conductive material comprises doped polysilicon.

17. The method of claim 15 wherein said step of depositing a second layer of electrically conductive material comprises the steps of:
depositing a lower layer of doped polysilicon;
depositing an intervening layer of sacrificial material;
removing the intervening layer of sacrificial material; and
depositing an upper layer of doped polysilicon.

18. The method claim 15 further comprising the steps of:
depositing a fourth layer of electrically conductive material above the third layer of electrically conductive material; and
forming at least one elevated crossing line from the fourth layer of electrically conductive material, wherein the elevated crossing line formed from the fourth layer of electrically conductive material is formed to overlie the elevated crossing line formed from the third layer of electrically conductive material such that the elevated crossing lines formed from the third and fourth layers of electrically conductive material together form a two layer elevated crossing line.

19. The method claim 18 further comprising the steps of:
forming at least one crossing line shield wall from the third layer of electrically conductive material; and
forming at least one crossing line shield wall from the fourth layer of electrically conductive material, wherein the crossing line shield wall formed from the fourth layer of electrically conductive material is formed to overlie the crossing line shield wall formed from the third layer of electrically conductive material such that the crossing line shield walls formed from the third and fourth layers of electrically conductive material together define an enclosed area within which the two layer elevated crossing line is located.

20. The method of claim 19 wherein in said steps of depositing first, second, third, and fourth layers of electrically conductive material, the first, second, third, and fourth layers of electrically conductive material comprise doped polysilicon.

21. The method of claim 19 further comprising the step of:
depositing a fifth layer of electrically conductive material above the fourth layer of electrically conductive material; and
forming a shield from the fifth layer of electrically conductive material, wherein the shield is formed to overlie the enclosed area defined by the crossing line shield walls formed from the third and fourth layers of electrically conductive material and be positioned in a spaced relation above the two layer elevated crossing line.

22. The method of claim 21 wherein in said step of depositing a fifth layer of electrically conductive material, the fifth layer of electrically conductive material comprises doped polysilicon.

23. The method claim 15 further comprising the step of:

forming at least one crossing line shield wall from the third layer of electrically conductive material, wherein the crossing line shield wall is formed to define an enclosed area within which the elevated crossing line is located.

24. The method claim 23 further comprising the step of:

depositing a fourth layer of electrically conductive material above the third layer of electrically conductive material; and forming a shield from the fourth layer of electrically conductive material, the shield being formed to overlie the enclosed area defined by the crossing line shield wall formed from the third layer of electrically conductive material and to be positioned in a spaced relation above the elevated crossing line formed from the third layer of electrically conductive material.

25. The method of claim 24 wherein in said step of depositing a fourth layer of electrically conductive material, the fourth layer of electrically conductive material comprises doped polysilicon.

* * * * *